United States Patent [19]
Pascucci

[11] Patent Number: 5,815,457
[45] Date of Patent: Sep. 29, 1998

[54] BIT LINE SELECTION DECODER FOR AN ELECTRONIC MEMORY

[75] Inventor: Luigi Pascucci, Sesto San Giovanni, Italy

[73] Assignee: SGS-Thomson Microelectronics S.r.l., Agrate Brianza, Italy

[21] Appl. No.: 659,665

[22] Filed: Jun. 6, 1996

[30] Foreign Application Priority Data

Jun. 26, 1995 [EP] European Pat. Off. .............. 95830267

[51] Int. Cl.$^6$ ...................................................... G11C 8/00
[52] U.S. Cl. ................................. 365/230.06; 365/230.03; 365/63
[58] Field of Search ......................... 365/230.06, 230.03, 365/230.08, 189.01, 63

[56] References Cited

U.S. PATENT DOCUMENTS

| | | | |
|---|---|---|---|
| 4,916,336 | 4/1990 | Houston | 307/449 |
| 5,297,105 | 3/1994 | Matsui et al. | 365/230.06 |
| 5,371,713 | 12/1994 | Ogiue et al. | 365/230.06 |
| 5,416,748 | 5/1995 | Fujita | 365/230.03 |

FOREIGN PATENT DOCUMENTS

A-0-493 293  7/1992  European Pat. Off. .......... G11C 7/00

OTHER PUBLICATIONS

European Search Report from European Patent Application 95830267.1, filed Jun. 26, 1995.
1990 IEEE International Solid State Circuits Conference, Feb. 1990, S. Francisco, US pp. 132–281 Hirose et al., "A 20 NS 4MB CMOS SRAM with Hierarchical World Decoding Architecture".

Primary Examiner—Vu A. Le
Attorney, Agent, or Firm—Wolf, Greenfield & Sacks, P.C.

[57] ABSTRACT

A bit line selection decoder for an electronic memory having a plurality of bit lines in a plurality of groups includes a first set of a plurality of switches, each switch for selecting one of the plurality of bit lines in response to a control signal from a set of control lines applied to each group of bit lines. A second set of a plurality of switches is provided wherein each switch selects one group of the plurality of bit lines. The bit line selection decoder also includes a decoder which has a first input bus of control lines and a second input bus of control lines, wherein the control lines from the first and second input bus address any one of the plurality of groups of bit lines. The decoder has a plurality of outputs, wherein each output drives one switch in the second set of switches. The decoder may include a plurality of modules. Each module has a first input connected to receive one of the control lines from the second bus and a second input connected to receive the control lines of the first bus. The module includes a mechanism for activating a first output according to a combination of the first input and one of the control lines from the second input and a mechanism for activating a second output according to a combination of the first input and another of the control lines from the second input.

30 Claims, 6 Drawing Sheets

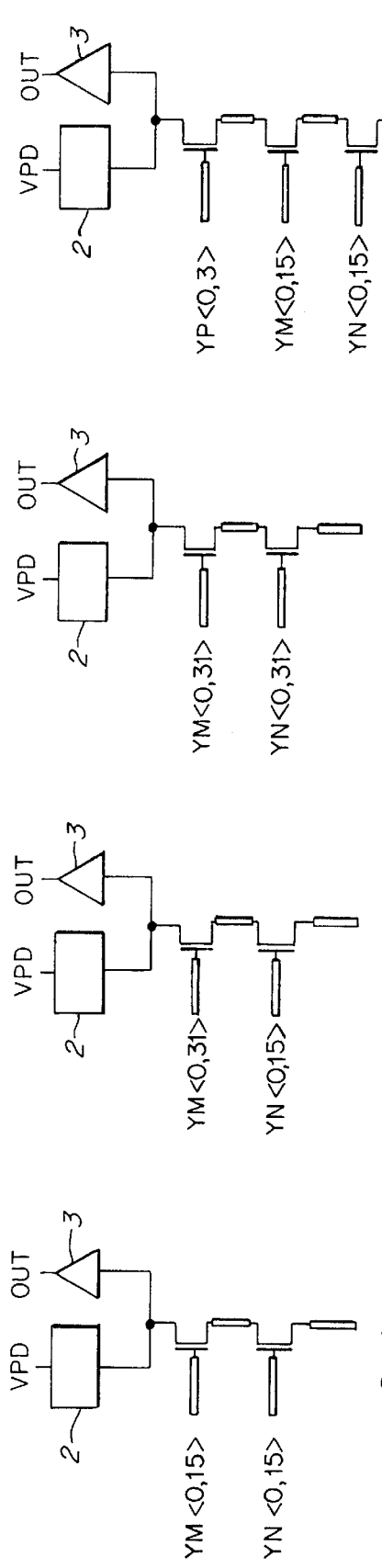
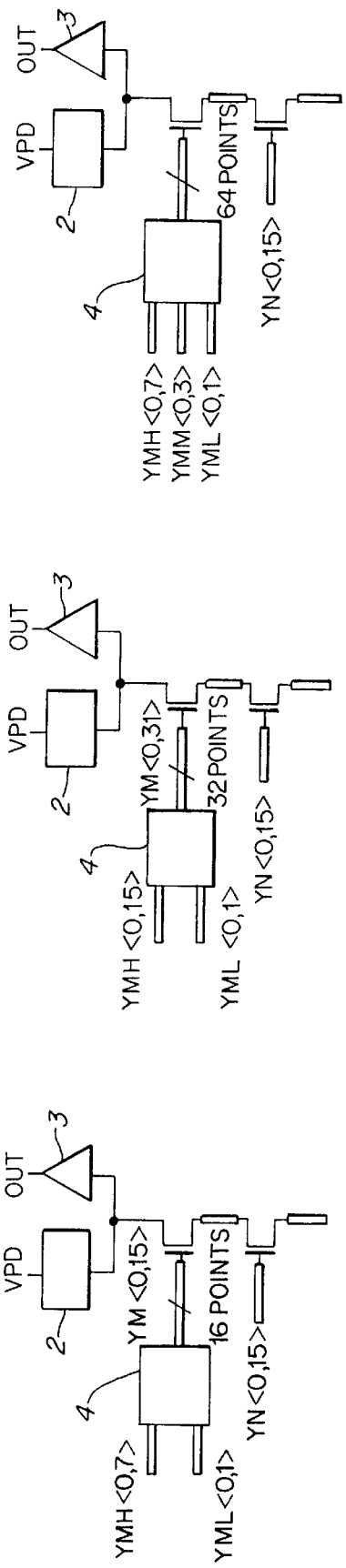

BIT LINE SELECTION DECODER FOR AN ELECTRONIC MEMORY

BACKGROUND OF THE INVENTION

1. Field of the Invention

The present invention relates to a bit line selection decoder, particularly for electronic memories, and to an electronic memory containing such a decoder.

2. Discussion of the Related Art

In an electronic memory, it is sometimes necessary to select one or more of the bit lines of the electronic memory, for example in order to program it. The most obvious solution would be to place a transistor on each one of the bit lines and switch it on, using a control line, when it is necessary to select the respective bit line. Since an electronic memory has a large number of these bit lines, the control lines that switch on the transistors would be too many and would occupy a vast area of the silicon on which the electronic memory is produced.

A current solution is to divide the bit lines into groups, for example including sixteen lines, and to select a particular group by means of a single bit line that is hierarchically higher and is in turn activated by a single transistor. The particular bit line is then selected within the particular group. An example of such a structure is shown in FIG. 1.

A single control line YM0, which is hierarchically higher, activates the bit line $A_1$, which leads to the sixteen-line group GR1. Each one of the sixteen lines of the group GR1 is activated by a respective control line YN0–YN15 by means of the respective transistor. It should be noted that in the illustrated example, there are sixteen groups GR1–GR16 (although they are not shown), and therefore hierarchically higher control lines YM0–YM15. In this manner it is possible to create a tree or pyramid structure with a plurality of hierarchy levels.

Finally, the selected bit line can be either programmed by a programming circuit 2 or amplified by an amplifier 3.

Although this solution is efficient, there are a large number of control lines for activating the bit lines. These control lines occupy a considerable area of the chip on which they are integrated, which is undesirable.

Accordingly, a general aim of the present invention is to provide a bit line selection decoder and an electronic memory containing such a decoder which reduces the number of control lines that activate individual bit lines.

SUMMARY OF THE INVENTION

Thus, one object of the present invention is to provide a bit line selection decoder capable of reducing the chip area used for the selection of individual bit lines.

Another object of the present invention is to provide a bit line selection decoder having a relatively low resistive path for the transistors.

Another object of the present invention is to provide a bit line selection decoder that is highly reliable and relatively easy to manufacture at competitive costs.

Accordingly, one aspect of the present invention is a bit line selection decoder for an electronic memory having a plurality of bit lines in a plurality of groups. This bit line selection decoder includes a first set of a plurality of switches, each switch for selecting one of the plurality of bit lines in response to a control signal from a set of control lines applied to each group of bit lines. A second set of a plurality of switches is provided wherein each switch selects one group of the plurality of bit lines. The bit line selection decoder also includes a decoder which has a first input bus of control lines and a second input bus of control lines, wherein the control lines from the first and second input bus address any one of the plurality of groups of bit lines. The decoder has a plurality of outputs, wherein each output drives one switch in the second set of switches.

Another aspect of the invention is an electronic memory containing such a bit line selection decoder which connects a selected bit line to a programming unit, for programming of the selected bit line, or to an amplifier for amplifying any signal on the selected bit line.

In one embodiment, the decoder includes a plurality of modules. Each module has a first input connected to receive one of the control lines from the second bus and a second input connected to receive the control lines of the first bus. It also includes a mechanism for activating a first output according to a combination of the first input and one of the control lines from the second input and a mechanism for activating a second output according to a combination of the first input and another of the control lines from the second input.

In another embodiment, the outputs of the decoder are connected to the second set of switches by points of negligible length.

In another embodiment, the decoder includes a plurality of modules. Each module has a first transistor of a first polarity having a source, a drain connected to a first reference voltage and a gate driven by a first control line of the first bus. A second transistor of the first polarity has a source, a drain connected to the first reference voltage and a gate driven by a second control line of the first bus. A third transistor of the first polarity is connected between the source of the first transistor and the source of the second transistor and has a gate driven by a control line of the second bus. A fourth transistor of a second polarity has a source, a drain connected to the source of the first transistor and a gate. The module has a first output connected to the drain of the fourth transistor and a second output connected to the gate of the fourth transistor. A fifth transistor of the second polarity has a source, a drain connected to the source of the second transistor and the second output, and a gate connected to the first output. A sixth transistor of the second polarity has a source connected to a second reference voltage, a drain connected to the source of the fourth transistor and to the source of the fifth transistors, and a gate driven by the control line of the second bus. The first and second outputs are outputs of the decoder. In this embodiment, a module also may include an eighth transistor of the first polarity connecting the first output and the source of the first transistor and having a gate driven by a third reference voltage. A ninth transistor of the first polarity may connect the second output and the source of the second transistor and has a gate driven by the third reference voltage. The module also may have a tenth transistor of the first polarity connecting the first output and the second output and having a gate driven by a control line of a third bus of control lines. An eleventh transistor of the second polarity is then used to connect the drain of the sixth transistor to the source of the fourth transistor and the source of the second transistor. This transistor has a gate driven by the control line of the third bus. The module also may have a drain stress transistor connected between the first output and the second output and having a gate driven by a drain stress signal.

In another embodiment, the decoder comprises a plurality of modules. Each module includes a NOR gate having a first input for receiving one of the control lines of the first bus, and a second input for receiving one of the control lines of the second bus and an output. A first transistor of a first polarity has a source connected to the output of the NOR gate, a drain and a gate driven by a first reference voltage. An inverter has an input connected to the drain of the first transistor at a node and an output. A second transistor of a second polarity is connected between a second reference voltage and the node and has a gate driven by the output of the inverter. In this embodiment, the module may have a drain stress transistor connected between the node and a third reference voltage, which has a gate driven by a drain stress signal. In this embodiment, the number of modules generally is equal to the number of outputs of the decoder.

In another embodiment, the decoder comprises a plurality of modules. Each module includes a NOR gate having a first input for receiving a control line from the first input bus and a second input for receiving a control line from the second input bus and an output. A first transistor of a first polarity is connected to a first reference voltage and has a gate driven by the output of the NOR gate. An inverter has an input connected to the output of the NOR gate and an output. A second transistor of the first polarity is connected to the first reference voltage and has a gate driven by the output of the inverter. A third transistor of a second polarity is series-connected to a second reference voltage and to the first transistor and a first node and has a gate. A fourth transistor of the second polarity is series-connected to the second reference voltage and to the second transistor at a second node and has a gate connected to the first node, wherein the gate of the third transistor is connected to the second node. In this embodiment the number of modules generally is equal to the number of outputs of the decoder. Additionally, the NOR gate may have a third input for receiving a drain stress signal.

BRIEF DESCRIPTION OF THE DRAWINGS

The characteristics and advantages of the invention will become apparent from the description of several embodiments thereof, illustrated only by way of non-limitative example in the accompanying drawings, wherein:

FIG. 2a is a view showing the circuit of FIG. 1 according to a different method;

FIG. 2b is a view of another example of a known bit line selection circuit, shown according to the method of FIG. 2a;

FIG. 2c is a view of another example of a known bit line selection circuit, shown according to the method of FIG. 2a;

FIG. 2d is a view of another example of a known bit line selection circuit, shown according to the method of FIG. 2a;

FIG. 3a is a view of the embodiment of the circuit of FIG. 2a with the decoder according to the present invention;

FIG. 3b is a view of the embodiment of the circuit of FIG. 2b with the decoder according to the present invention;

FIG. 3c is a view of the embodiment of the circuit of FIGS. 2c and 2d with the decoder according to the present invention;

DETAILED DESCRIPTION

Figure 1:
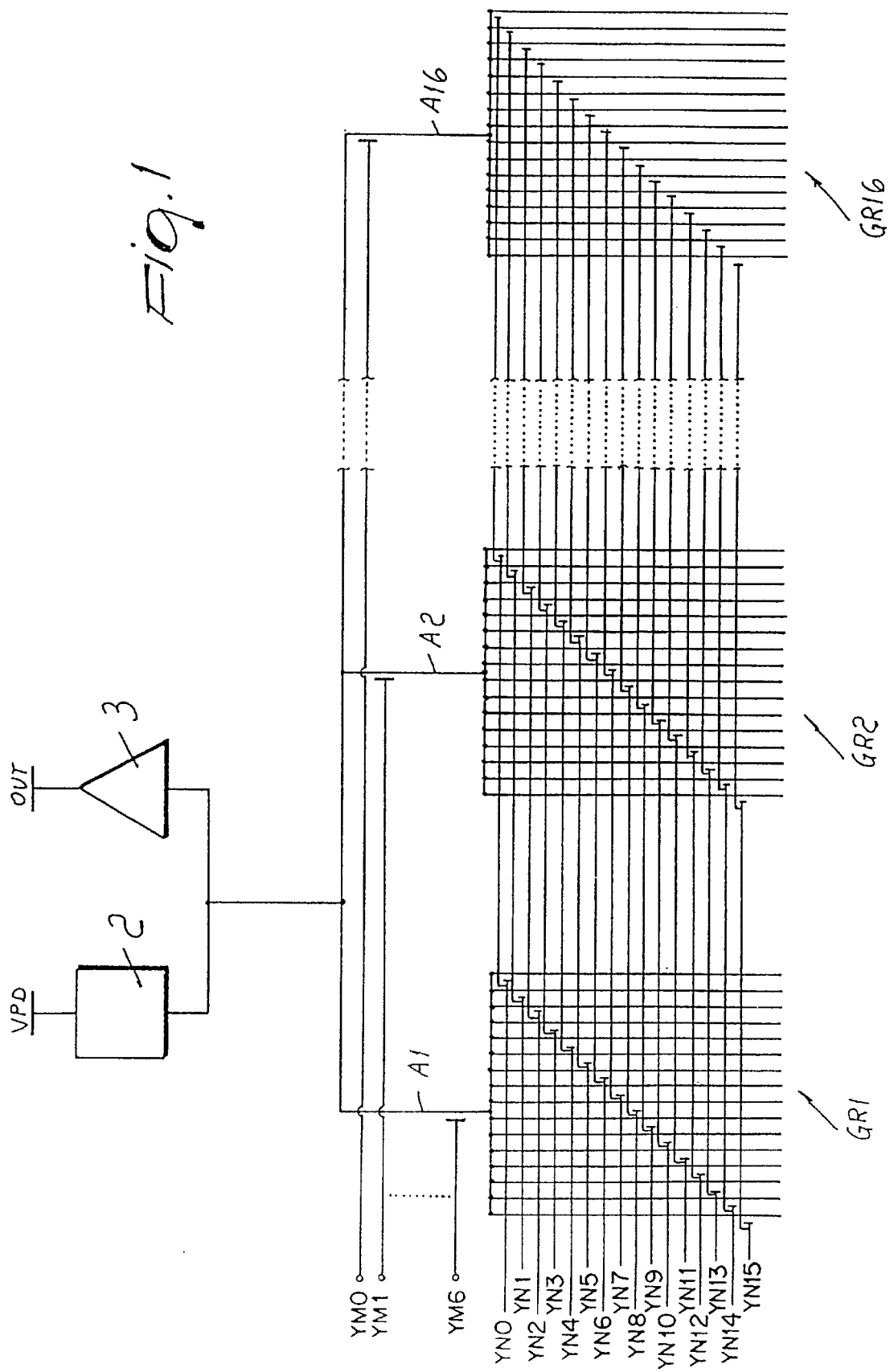
FIG. 1 is an electrical diagram of a known bit line selection circuit.

FIG. 2a is a simplified diagram of the circuit of FIG. 1. The plurality of bit and control lines are shown as single buses. The first bus of the control lines comprises the hierarchically higher lines YM<0,15>, whereas the hierarchically lower bit lines are selected by the control lines YN<0,15>. The output is constituted by 256 (16×16) bit lines BL<0,255>, from which a single bit line is selected.

FIG. 2b is a diagram of another possible known bit line selection circuit. There are 32 hierarchically higher control lines YM<0,31> and 16 hierarchically lower control lines YN<0,15>. The output is constituted by 512 (32×16) bit lines BL<0,511>.

FIG. 2c is a diagram of another possible known bit line selection circuit. There are 32 hierarchically higher control lines YM<0,31> and 32 hierarchically lower control lines YN<0,31>. The output is constituted by 1024 (32×32) bit lines BL<0,1023>.

FIG. 2d is a diagram of another possible known bit line selection circuit with three hierarchical levels. There are four hierarchically higher control lines YP<0,3>, sixteen hierarchically intermediate control lines YM<0,15>, and sixteen hierarchically lower control lines YN<0,15>. The output is constituted by 1024 (4×16×16) bit lines BL<0,1023>.

FIG. 3a is a diagram of an embodiment of the present invention which improves on the selection circuit of FIG. 2a.

The bus of the hierarchically higher control lines YM is divided into two buses: a first bus with eight lines YMH<0, 7> and a second bus with two lines YML<0,1>. These buses constitute the input of a local decoder 4, the output whereof is constituted by sixteen connection points YM<0,15>. The connections to the transistors that activate a bit line are termed "points", since their length is negligible.

In this manner, the number of control lines for the hierarchically higher lines is reduced by 16−(2+8)=6, since now only ten lines are required to activate sixteen transistors.

FIG. 3b is a diagram of an embodiment of the present invention which improves on the selection circuit of FIG. 2b.

The input of the local decoder 4 is constituted by a first bus with sixteen lines YMH<0,15> and by a second bus with two lines YML<0,1>. The saving is evident. Instead of using thirty-two lines, as in the case of FIG. 2b, it is possible to use only (2+16)=18 control lines.

The number of points YM<0,31> remains 32, which is the same as the number of lines YM<0,31> in FIG. 2b.

FIG. 3c is a diagram of another embodiment of the present invention which improves on the selection circuits of FIGS. 2c and 2d. The decoder 4 now has three input buses: a first one YMH<0,7>, with eight control lines;

a second one YMM<0,3>, with four control lines; and a third one YML<0,1>, with two control lines. The number of points, that is to say, of lines of negligible length that drive the transistors is (2×4×8)=64. In this manner, the number of hierarchically higher control lines is reduced from 64 to 14, with a saving of 50 control lines.

Figure 4A:
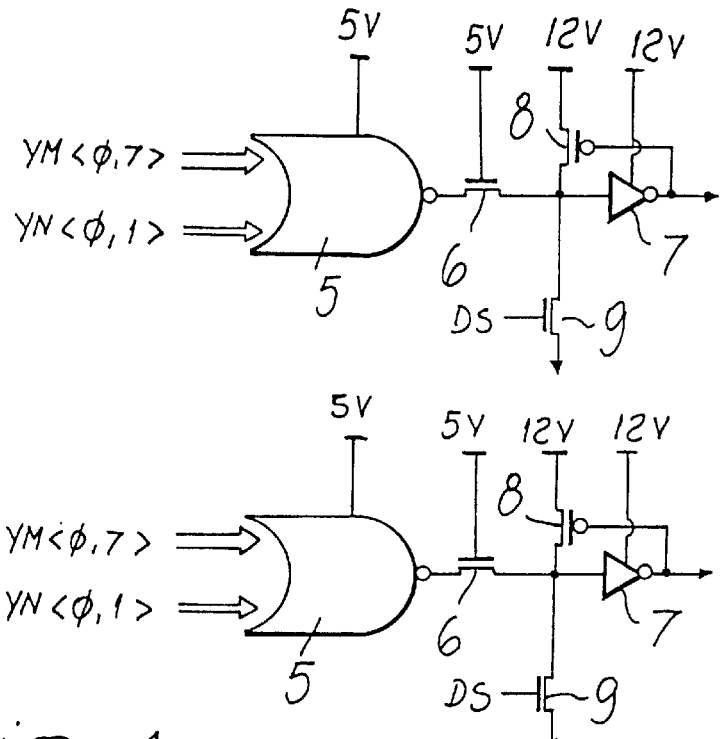
FIG. 4a is a partial view of a possible embodiment of the decoder according to the present invention.

The partial diagram of a possible embodiment of the decoder 4 is shown in FIG. 4a.

This Figure shows only two of sixteen modules composing the decoder of this embodiment. The decoder has two input buses, a high one with eight bits YM<0,7> and a low one with two bits YN<0,1> ("0" in a field of "1"). Each module in this example is composed of a NOR gate 5, with a supply voltage at five volts. The output of the NOR gate 5 is series-connected to a decoupling transistor 6 of the N-channel type, the gate whereof is connected to the five volts supply. The decoupling transistor 6 is furthermore connected to an inverter 7, with a supply voltage at twelve volts. The output of the inverter 7 is connected to the gate of a P-channel transistor 8 interposed between the twelve volts supply and the input of the inverter 7. The input of the inverter is furthermore connected to ground by means of an N-channel transistor 9, called a drain stress transistor, which has the purpose of setting all the outputs of the decoder to logic level "1". This is required when the devices must be controlled to reject weak devices.

When the output of the NOR gate 5 is at five volts, the input of the inverter 7 is at four volts, due to the drain/gate drop of the decoupling transistor 6. In this case, the output of the inverter 7 is brought to zero volts and switches on the P-channel transistor 8, which brings the input of the inverter 7 to twelve volts. The P-channel transistor has the purpose of decoupling the inverter 7 without however causing the inverter to absorb current. The circuit is furthermore configured so as to carry the logic levels defined by zero and five volts to logic levels defined by a higher voltage, e.g. zero and twelve volts, since these levels are used by non-volatile memories.

If the output of the NOR gate 5 is zero volts, the input of the inverter 7 is equally at zero volts, then the output of the inverter 7 is at twelve volts, and the P-channel transistor 8 is off. If one wishes to control the device, the gate of the drain stress transistor 9 is set to logic level "1", so that the output of the inverter becomes logic level "1".

This embodiment uses four transistors of the NOR gate, two transistors of the inverter, and two transistors that are shown (the drain stress transistor is not counted). Therefore, sixteen transistors are used for two modules (two outputs).

Figure 4B:
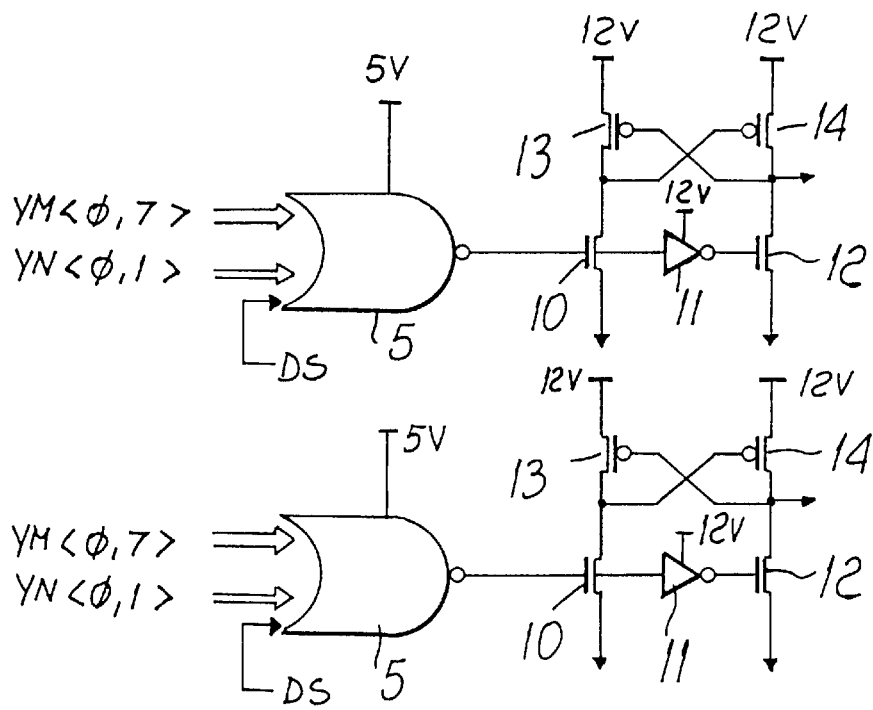
FIG. 4b is another partial view of a possible embodiment of the decoder according to the present invention.

Another possible embodiment of the decoder 4 is shown partially in FIG. 4b.

As in the previous case, only two of sixteen modules are shown in the figure. Each module comprises a NOR gate 5 receiving a supply voltage of five volts. The output of the NOR gate 5 is connected to the gate of a first N-channel transistor 10 and to the input of an inverter 11, receiving a supply voltage of twelve volts. The output of the inverter is connected to the gate of a second N-channel transistor 12. The drain of the first transistor 10 is connected to the source of a third transistor 13 of the P-channel type and its source is connected to ground. The drain of the third transistor 13 is connected to a supply voltage of twelve volts. The source of the second transistor 12 is connected to ground and its drain is connected to the source of a fourth transistor 14 of the P-channel type. The drain of the fourth transistor 14 is connected to a supply voltage of twelve volts. The drain of the first transistor 10 is furthermore connected to the gate of the fourth transistor 14 and the drain of the second transistor is connected to the gate of the third transistor 13. The output OUT of the module is provided by the drain of the second transistor 12.

When the output of the NOR gate 5 is at five volts, that is to say, at logic level "1", the output of the inverter 11 becomes zero volts. In this manner, the first transistor 10 is activated, connecting the gate of the fourth transistor 14 to ground. In this manner, the fourth transistor 14 brings the output of the module to twelve volts, whereas the second transistor 12 does not conduct. The third transistor 13 is switched off, since the output OUT is at twelve volts.

Instead, when the output of the NOR gate 5 is at zero volts, that is to say, at logic level "0". the output of the inverter 11 reaches twelve volts and switches on the second transistor 12, whereas the first transistor 10 is switched off. In this manner, the output OUT is set to zero volts by the second transistor 12, which switches on the third transistor 13, which brings the gate of the fourth transistor 14 to twelve volts, so that said fourth transistor does not conduct.

The embodiment of FIG. 4b is better than the embodiment of FIG. 4a in terms of efficiency and decoupling; however, since one module requires four transistors for the NOR gate, two for the inverter, and four transistors, which are shown, twenty transistors are used for two modules.

Both the decoder of FIG. 4a and the decoder of FIG. 4b are not very efficient in terms of saving space on the chip, since to save six control lines one requires 128 transistors and the other requires 160 transistors.

Figure 5:
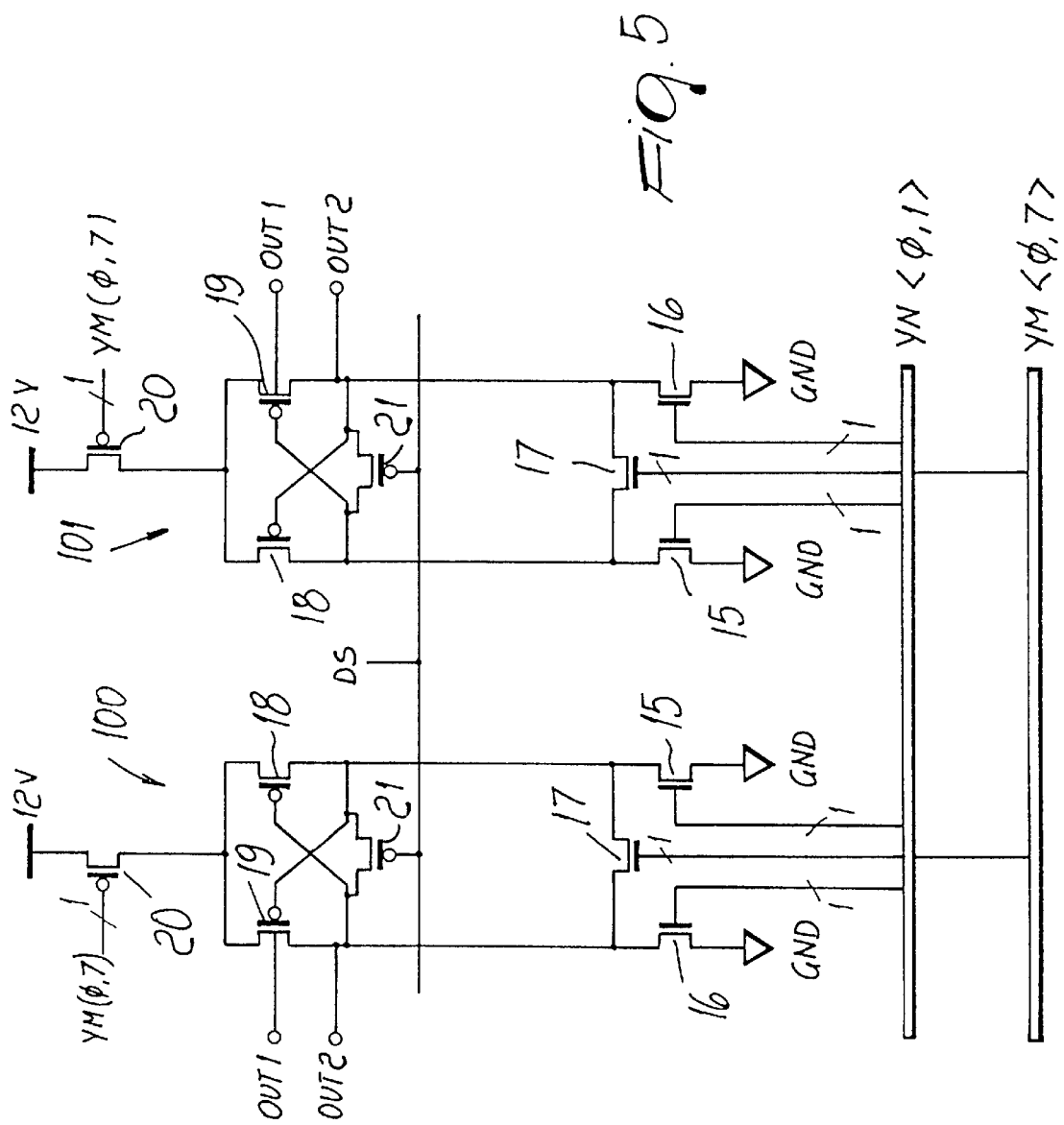
FIG. 5 is a partial view of another possible embodiment according to the present invention, provided with two input buses.

FIG. 5 is a diagram of an improved and preferred embodiment of the decoder 4 according to the present invention.

As in the previous cases, there are two buses with the control lines, a first one YN<0,1> composed of two control lines and a second one YM<0,7> composed of eight control lines.

Both buses have a "1" prevalence, that is to say, all the control lines of a specific bus carry logic level "1" except for one, which selects the bit line and carries logic level "0". Thus, since the first bus YN<0,1> has only two lines, it always has one of the control lines at logic level "0" and the other control line at logic level "1".

This decoder, too, is composed of modules. However, in this case each module produces two outputs of the decoder and therefore only eight modules are needed to provide sixteen output. FIG. 5 shows only two (100 and 101) of the eight modules.

The connections between the buses and each individual module are identical and therefore only the connections to a single module are described.

The first control line of the bus YN<0,1> drives a first N-channel transistor 15, the source whereof is connected to the ground. Likewise, the second control line of the bus YN<0,1> drives a second N-channel transistor 16, the source whereof is connected to ground. The same holds for all the modules of the decoder.

The drains of the first transistor 15 and of the second transistor 16 are connected by means of a third N-channel transistor 17, which is driven by a single control line of the second bus YM<0,7>. The third transistor 17, in each one of the modules, is driven by a single control line of the second bus YM<0,7>.

The drains of the first transistor 15 and of the second transistor 16 are connected to a cross-coupled structure. More specifically, the drain of the first transistor 15 is connected to the source of a fourth transistor 18 of the P-channel type and the drain of the second transistor 16 is connected to the source of a fifth transistor 19, which is also of the P-channel type. The drains of the fourth transistor 18 and of the fifth transistor 19 are connected to the source of a sixth transistor 20 of the P-channel type, which is driven by the same control line of the bus YM<0,7> that drives the third transistor 17. The drain of the sixth transistor 20 is connected to a supply voltage of twelve volts. The source of the fourth transistor 18 is connected to the gate of the fifth transistor 19 and to a first output OUT1. The source of the fifth transistor 19 is connected to a second output OUT2 and to the gate of the fourth transistor 18.

Furthermore, in order to obtain the drain stress effect, there is a seventh transistor 21 of the P-channel type that connects the two outputs OUT1 and OUT2.

All of the gates of the seventh transistors 21 of each of the individual modules are driven by a single line by means of the activation signal DS.

The operation of the decoder according to this embodiment is as follows.

With reference to FIG. 5, assume that the first transistor 15 of the two modules 100 and 101 is controlled by a control line that carries logic level "0" and that the second transistor 16 of the two modules 100 and 101 is driven by a control line that carries logic level "1". Furthermore, assume that the third transistor 17 of the module 100 is driven by a control line that carries logic level "1" and that the third transistor 17 of the module 101 is driven by a control line that carries logic level "0". Likewise, the sixth transistor 20 of the two modules is driven by the same line that drives the third transistor 17.

We first analyze the module 100. The first transistor 15 is off, whereas the second transistor 16 is on, connecting its drain to ground. The third transistor 17 is also on and connects the drain of the first transistor 15 to ground. In this manner, the first output OUT1 and the second output OUT2 are connected to the ground. The fourth transistor 18 and the fifth transistor 19 are on, but the sixth transistor 20 is not, and therefore the twelve volts supply does not affect the outputs of the circuit.

We now consider the module 101. The first transistor 15 is off, whereas the second transistor 16 is on and connects its drain and the second output OUT2 to ground. The third transistor 17 is off and does not connect the drain of the first transistor 15 to ground. The fourth transistor 18 and the sixth transistor 20 are on and bring the first output OUT1 to twelve volts (logic level "1"). The fifth transistor 19 is off and the supply voltage of twelve volts does not affect the second output OUT2, which is connected to ground.

By changing the polarity of the control lines of the first bus YN<0,1>, that is to say, by applying a voltage corresponding to logic level "1" on the first transistor 15 and a voltage corresponding to logic level "0" on the second transistor, the outputs of each module are inverted. By applying the voltage corresponding to logic level "0" to the third transistor 17 and to the sixth transistor 20 of the module 100, one of the outputs of the module 100 would reach twelve volts (of course, the third transistor 17 and the sixth transistor 20 of the remaining modules would have to be activated by a voltage corresponding to logic level "1").

Figure 6:
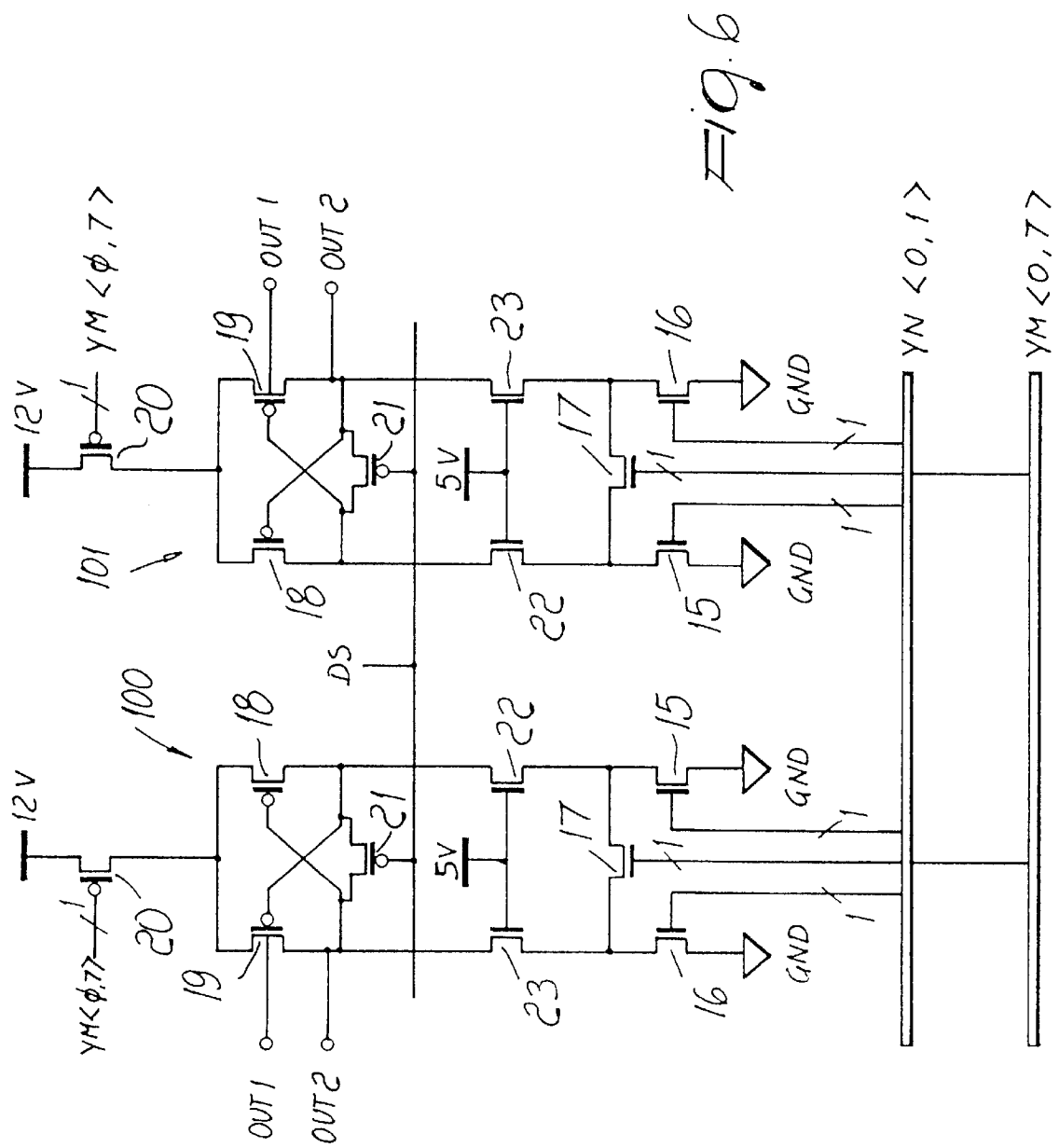
FIG. 6 is a view of an improved embodiment of the circuit of FIG. 5.

FIG. 6 is a diagram of an improved embodiment of the decoder of FIG. 5.

Each module of the decoder of FIG. 6 is practically identical to the modules of FIG. 5, except that there are an eighth transistor 22, of the N-channel type, placed between the first transistor 15 and the fourth transistor 18, and a ninth transistor 23, of the N-channel type, placed between the second transistor 16 and the fifth transistor 19. The gates of the transistors 22 and 23 are connected to a supply voltage of five volts. The transistors 22 and 23 have a cascaded structure that improves the resistance of the structure to breakdown, since the voltage at the drains of the first transistor 15 and of the second transistor 16 drop to four volts (five volts minus the switch-on threshold of the transistors 22 and 23, which is approximately one volt). In this manner, the voltage at the drains never reaches twelve volts, which might damage the transistors 15 and 16.

Figure 7:
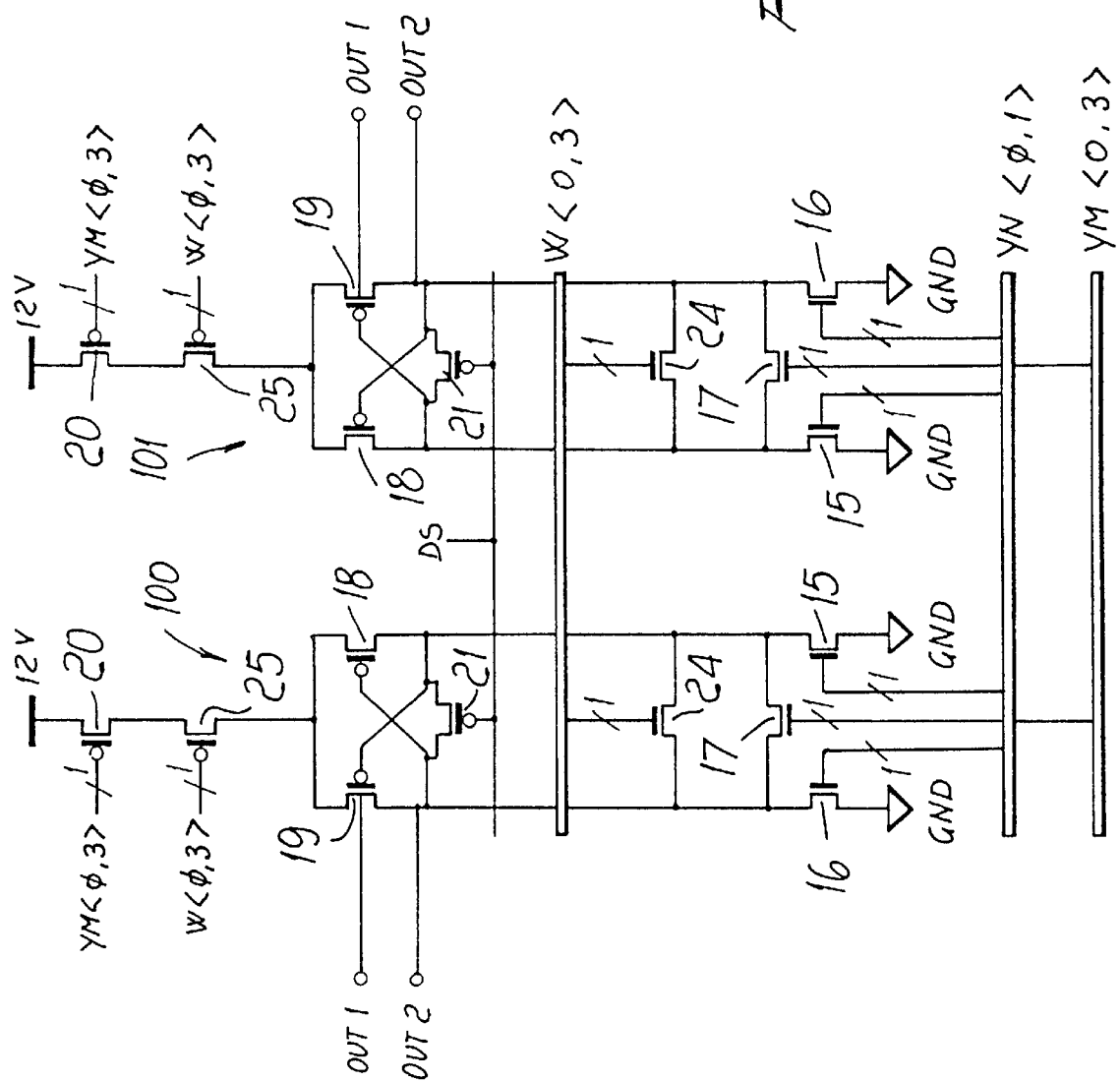
FIG. 7 is a view of an embodiment of the circuit of FIG. 5, provided with three input buses.

FIG. 7 is a diagram of an embodiment with three control line buses.

Apart from the two buses that have already been described earlier, the first one YN<0,1> and the second one YM<0,3>, which now has four control lines, a third bus W<0,3> is now also provided, that is also configured with "0" in a field of "1" and has four control lines. In this manner, the decoder has (2×4×4)=32 outputs or "points", and therefore includes sixteen modules, since each module generates two outputs.

With respect to the configuration of FIG. 5, a tenth transistor 24 of the N-channel type is now provided that connects the outputs OUT1 and OUT2 of each module and is parallel-connected to the third transistor 17. This tenth transistor 24 is driven by a single control line of the third bus W<0,3>.

There is also an eleventh transistor 25 of the P-channel type that is series-connected to the sixth transistor 20. The operation of this embodiment can be deduced from the description of the operation of the embodiment of FIG. 5; however, it can be said that the output OUT1 or OUT2 is selected only in the modules in which the parallel-connected transistors 17 and 24 are driven by a voltage corresponding to logic level "0".

In order to achieve complete decoding, the modules receive as inputs all the possible combinations of the lines of the three buses.

The control lines of the buses that are connected to each module are shown in the following Table 1:

TABLE 1

| MODULE | BUS YM<0,3> | BUS W<0,3> | BUS YN<0,1> |
| --- | --- | --- | --- |
| Module 1 | YM0 | W0 | YN0 and YN1 |
| Module 2 | YM1 | W0 | YN0 and YN1 |
| Module 3 | YM2 | W0 | YN0 and YN1 |
| Module 4 | YM3 | W0 | YN0 and YN1 |
| Module 5 | YM0 | W1 | YN0 and YN1 |
| Module 6 | YM1 | W1 | YN0 and YN1 |
| Module 7 | YM2 | W1 | YN0 and YN1 |
| Module 8 | YM3 | W1 | YN0 and YN1 |
| Module 9 | YM0 | W2 | YN0 and YN1 |
| Module 10 | YM1 | W2 | YN0 and YN1 |
| Module 11 | YM2 | W2 | YN0 and YN1 |
| Module 12 | YM3 | W2 | YN0 and YN1 |
| Module 13 | YM0 | W3 | YN0 and YN1 |
| Module 14 | YM1 | W3 | YN0 and YN1 |
| Module 15 | YM2 | W3 | YN0 and YN1 |
| Module 16 | YM3 | W3 | YN0 and YN1 |

From the above table it is evident how it is possible to provide the progression for decoders having more buses and buses with a different number of control lines.

Finally, in order to achieve the drain stress effect, the signals on the control lines and on the drain stress transistor 21 are set to a voltage corresponding to logic level "0". In this manner, all the outputs of the decoder reach a voltage corresponding to logic level "1".

The foregoing embodiments of the invention reduce the number of control lines that activate individual bit times. In particular, it is noted that for the embodiment of FIG. 5, only six transistors are used for two outputs of the decoder. Therefore, for a decoder having a bus with eight lines YM<0,7> and a bus with two lines YN<0,1>, the total number of transistors is 48, which is much less than the 128 transistors used for the decoder of FIG. 4a and the 160 transistors used for the decoder of FIG. 4b. In this manner, the number of transistors used does not have a strong negative effect on the saving in chip area achieved by reducing the number of control lines.

Furthermore, with reference to FIG. 2d, too many hierarchy levels are avoided, since the decoder according to the present invention allows there to be a smaller number of hierarchical levels of bit lines. In this manner, increasing the dimensions of the bit line selection transistor, which slows the circuit, can be avoided so as to keep the bit line circuit impedance low.

Furthermore, since long control lines are avoided, as shown in FIG. 1, the capacitance of the "points" that drive the selection transistors remains limited, to the benefit of the speed of the circuit.

Finally, in the case of a broken bit line matrix array, that is to say, when a single control line drives two selection transistors in respective symmetrical bit line circuits, since "points" are used instead of control lines for the activation of the selection transistors, the capacitance of these points is low and the points can be used to drive more than one transistor. In this manner, it is possible to increase the dimensions of the selection transistors to decrease the impedance of the bit line circuit.

Having now described an example embodiment of the present invention, it should be apparent that the present invention is susceptible of numerous modifications and variations.

For example, the decoder can be provided dually, that is to say, by inverting the nature of the transistors, the logic levels of the buses and of the supply lines, and of course opposite selection placement.

Finally, all the details may furthermore be replaced with other technically equivalent ones.

In practice, the materials employed, as well as the shapes and the dimensions, may be selected according to requirements of a given design.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A bit line selection decoder for an electronic memory having a plurality of bit lines in a plurality of groups, comprising:

for each group of bit lines, a first set of a plurality of switches, each switch for selecting one of the plurality of bit lines in the group in response to a control signal from a first set of control lines applied to each of the groups of bit lines;

a second set of a plurality of switches, each switch for selecting one of the groups of the plurality of bit lines; and a decoder having a first input bus of control lines and a second input bus of control lines and having a plurality of outputs, each output for driving one switch in the second set of switches, wherein a product of a number of control lines of the first input bus and a number of control lines of the second input bus is equal to a number of the outputs of the decoder.

2. The bit line selection decoder of claim 1, wherein the decoder comprises a plurality of modules, wherein each module comprises:

a first input connected to receive one of the control lines from the second bus;

a second input connected to receive the control lines of the first bus;

a means for activating a first output according to a combination of the first input and one of the control lines from the second input; and means for activating a second output according to a combination of the first input and another of the control lines from the second input.

3. The bit line selection decoder of claim 1, wherein the outputs of the decoder are connected to the second set of switches by points of negligible length.

4. The bit line selection decoder of claim 1, wherein the decoder comprises a plurality of modules, wherein each module comprises:

a first transistor of a first polarity having a source, a drain connected to a first reference voltage and a gate driven by a first control line of the first bus;

a second transistor of the first polarity having a source, a drain connected to the first reference voltage and a gate driven by a second control line of the first bus;

a third transistor of the first polarity connected between the source of the first transistor and the source of the second transistor and having a gate driven by a control line of the second bus;

a fourth transistor of a second polarity having a source, a drain connected to the source of the first transistor and a gate, wherein the module has a first output connected to the drain of the fourth transistor and a second output connected to the gate of the fourth transistor;

a fifth transistor of the second polarity having a source, a drain connected to the source of the second transistor and the second output, and a gate connected to the first output;

a sixth transistor of the second polarity having a source connected to a second reference voltage, a drain connected to the source of the fourth transistor and to the source of the fifth transistors, and a gate driven by the control line of the second bus; and wherein the first and second outputs are outputs of the decoder.

5. The bit line selection decoder of claim 4, wherein the decoder comprises:

an eighth transistor of the first polarity connecting the first output and the source of the first transistor and having a gate driven by a third reference voltage; and a ninth transistor of the first polarity connecting the second output and the source of the second transistor and having a gate driven by the third reference voltage.

6. The bit line selection decoder of claim 4 wherein the decoder has an input for receiving a third bus of a plurality of control lines and wherein the decoder comprises:

a tenth transistor of the first polarity connecting the first output and the second output and having a gate driven by a control line of the third bus;

at least one eleventh transistor of the second polarity connecting the drain of the sixth transistor to the source of the fourth transistor and the source of the second transistor and having a gate driven by the control line of the third bus.

7. The bit line selection decoder of claim 4 further comprising a drain stress transistor connected between the first output and the second output and having a gate driven by a drain stress signal.

8. The bit line selection decoder of claim 7, herein the decoder comprises:
   an eighth transistor of the first polarity connecting the first output and the source of the first transistor and having a gate driven by a third reference voltage; and
   a ninth transistor of the first polarity connecting the second output and the source of the second transistor and having a gate driven by the third reference voltage.

9. The bit line selection decoder of claim 7, wherein the decoder has an input for receiving a third bus of a plurality of control lines and wherein the decoder comprises:
   a tenth transistor of the first polarity connecting the first output and the second output and having a gate driven by a control line of the third bus;
   at least one eleventh transistor of the second polarity connecting the drain of the sixth transistor to the source of the fourth transistor and the source of the second transistor and having a gate driven by the control line of the third bus.

10. The bit line selection decoder of claim 1, wherein the decoder comprises a plurality of modules, each module comprising:
    a NOR gate having a first input for receiving one of the control lines of the first bus, and a second input for receiving one of the control lines of the second bus and an output;
    a first transistor of a first polarity having a source connected to the output of the NOR gate, a drain and a gate driven by a first reference voltage;
    an inverter having an input connected to the drain of the first transistor at a node and an output;
    a second transistor of a second polarity connected between a second reference voltage and the node and having a gate driven by the output of the inverter.

11. The bit line selection decoder of claim 10, wherein the module comprises a drain stress transistor connected between the node and a third reference voltage, and having a gate driven by a drain stress signal.

12. The bit line selection decoder of claim 10, wherein the number of modules is equal to the number of outputs of the decoder.

13. The bit line selection decoder of claim 1, wherein the decoder comprises a plurality of modules, each module comprising:
    a NOR gate having a first input for receiving a control line from the first input bus and a second input for receiving a control line from the second input bus and an output;
    a first transistor of a first polarity connected to a first reference voltage and having a gate driven by the output of the NOR gate;
    an inverter having an input connected to the output of the NOR gate and an output;
    a second transistor of the first polarity connected to the first reference voltage and having a gate driven by the output of the inverter;
    a third transistor of a second polarity series-connected to a second reference voltage and to the first transistor and a first node and having a gate; and
    a fourth transistor of the second polarity series-connected to the second reference voltage and to the second transistor at a second node and having a gate connected to the first node, wherein the gate of the third transistor is connected to the second node.

14. The bit line selection decoder of claim 13, wherein the number of modules is equal to the number of outputs of the decoder.

15. The bit line selection decoder of claim 13, wherein the NOR gate has a third input for receiving a drain stress signal.

16. An electronic memory comprising:
    a plurality of bit lines;
    a bit line selection decoder, including:
      a first set of a plurality of switches, each switch for selecting one of the plurality of bit lines in response to a control signal from a set of control lines applied to each group of bit lines;
      a second set of a plurality of switches, each switch for selecting one group of the plurality of bit lines; and
      a decoder having a first input bus of control lines and a second input bus of control lines, wherein the control lines from the first and second input bus address any one of the plurality of groups of bit lines, and having a plurality of outputs, each output for driving one switch in the second set of switches;
    a programming circuit connected to the bit line selected by the bit line selection decoder for programming the selected bit line; and
    an amplifier connected to the bit line selected by the bit line selection decoder for amplifying a signal on the selected bit line.

17. The bit line selection decoder of claim 16, wherein the decoder comprises a plurality of modules, wherein each module comprises:
    a first input connected to receive one of the control lines from the second bus;
    a second input connected to receive the control lines of the first bus;
    means for activating a first output according to a combination of the first input and one of the control lines from the second input; and
    means for activating a second output according to a combination of the first input and another of the control lines from the second input.

18. The bit line selection decoder of claim 15, wherein the outputs of the decoder are connected to the second set of switches by points of negligible length.

19. The bit line selection decoder of claim 15, wherein the decoder comprises a plurality of modules, wherein each module comprises:
    a first transistor of a first polarity having a source, a drain connected to a first reference voltage and a gate driven by a first control line of the first bus;
    a second transistor of the first polarity having a source, a drain connected to the first reference voltage and a gate driven by a second control line of the first bus;
    a third transistor of the first polarity connected between the source of the first transistor and the source of the second transistor and having a gate driven by a control line of the second bus;
    a fourth transistor of a second polarity having a source, a drain connected to the source of the first transistor and a gate, wherein the module has a first output connected to the drain of the fourth transistor and a second output connected to the gate of the fourth transistor;
    a fifth transistor of the second polarity having a source, a drain connected to the source of the second transistor and the second output, and a gate connected to the first output;

a sixth transistor of the second polarity having a source connected to a second reference voltage, a drain connected to the source of the fourth transistor and to the source of the fifth transistors, and a gate driven by the control line of the second bus; and wherein the first and second outputs are outputs of the decoder.

20. The bit line selection decoder of claim 19, wherein the decoder comprises:

an eighth transistor of the first polarity connecting the first output and the source of the first transistor and having a gate driven by a third reference voltage; and a ninth transistor of the first polarity connecting the second output and the source of the second transistor and having a gate driven by the third reference voltage.

21. The bit line selection decoder of claim 19, wherein the decoder has an input for receiving a third bus of a plurality of control lines and wherein the decoder comprises:

a tenth transistor of the first polarity connecting the first output and the second output and having a gate driven by a control line of the third bus;

at least one eleventh transistor of the second polarity connecting the drain of the sixth transistor to the source of the fourth transistor and the source of the second transistor and having a gate driven by the control line of the third bus.

22. The bit line selection decoder of claim 19, further comprising a drain stress transistor connected between the first output and the second output and having a gate driven by a drain stress signal.

23. The bit line selection decoder of claim 22, wherein the decoder comprises:

an eighth transistor of the first polarity connecting the first output and the source of the first transistor and having a gate driven by a third reference voltage; and a ninth transistor of the first polarity connecting the second output and the source of the second transistor and having a gate driven by the third reference voltage.

24. The bit line selection decoder of claim 22, wherein the decoder has an input for receiving a third bus of a plurality of control lines and wherein the decoder comprises:

a tenth transistor of the first polarity connecting the first output and the second output and having a gate driven by a control line of the third bus;

at least one eleventh transistor of the second polarity connecting the drain of the sixth transistor to the source of the fourth transistor and the source of the second transistor and having a gate driven by the control line of the third bus.

25. The bit line selection decoder of claim 15, wherein the decoder comprises a plurality of modules, each module comprising:

a NOR gate having a first input for receiving one of the control lines of the first bus, and a second input for receiving one of the control lines of the second bus and an output;

a first transistor of a first polarity having a source connected to the output of the NOR gate, drain and a gate driven by a first reference voltage;

an inverter having an input connected to the drain of the first transistor at a node and an output;

a second transistor of a second polarity connected between a second reference voltage and the node and having a gate driven by the output of the inverter.

26. The bit line selection decoder of claim 25, wherein the module comprises a drain stress transistor connected between the node and a third reference voltage, and having a gate driven by a drain stress signal.

27. The bit line selection decoder of claim 25, wherein the number of modules is equal to the number of outputs of the decoder.

28. The bit line selection decoder of claim 15, wherein the decoder comprises a plurality of modules, each module comprising:

a NOR gate having a first input for receiving a control line from the first input bus and a second input for receiving a control line from the second input bus and an output;

a first transistor of a first polarity connected to a first reference voltage and having a gate driven by the output of the NOR gate;

an inverter having an input connected to the output of the NOR gate and an output;

a second transistor of the first polarity connected to the first reference voltage and having a gate driven by the output of the inverter;

a third transistor of a second polarity series-connected to a second reference voltage and to the first transistor and a first node and having a gate; and a fourth transistor of the second polarity series-connected to the second reference voltage and to the second transistor at a second node and having a gate connected to the first node, wherein the gate of the third transistor is connected to the second node.

29. The bit line selection decoder of claim 28, wherein the number of modules is equal to the number of outputs of the decoder.

30. The bit line selection decoder of claim 28, wherein the NOR gate has a third input for receiving a drain stress signal.

* * * * *